United States Patent
de Larios et al.

(10) Patent No.: US 7,591,613 B2
(45) Date of Patent: Sep. 22, 2009

(54) METHOD AND APPARATUS FOR TRANSPORTING A SUBSTRATE USING NON-NEWTONIAN FLUID

(75) Inventors: John M. de Larios, Palo Alto, CA (US); Mike Ravkin, Sunnyvale, CA (US); John Parks, Hercules, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/173,661

(22) Filed: Jul. 15, 2008

(65) Prior Publication Data
US 2008/0267721 A1 Oct. 30, 2008

Related U.S. Application Data

(62) Division of application No. 11/154,129, filed on Jun. 15, 2005, now Pat. No. 7,416,370.

(51) Int. Cl.
*B65G 51/16* (2006.01)
(52) U.S. Cl. .............................. 406/27; 406/26; 406/146
(58) Field of Classification Search .................. 406/26, 406/27, 112, 136, 141, 142, 146
See application file for complete search history.

(56) References Cited

U.S. PATENT DOCUMENTS

| | | | | |
|---|---|---|---|---|
| 4,573,830 A | * | 3/1986 | Richardson et al. | 406/84 |
| 5,068,040 A | * | 11/1991 | Jackson | 210/748 |
| 6,508,882 B1 | * | 1/2003 | Zeiffer et al. | 118/684 |
| 6,837,611 B2 | * | 1/2005 | Kuo | 366/168.2 |
| 7,140,393 B2 | * | 11/2006 | Sheydayi | 137/875 |
| 7,144,213 B2 | * | 12/2006 | Cartwright | 414/217 |
| 7,255,772 B2 | * | 8/2007 | Biberger et al. | 156/345.26 |
| 7,291,565 B2 | * | 11/2007 | Hansen et al. | 438/745 |
| 7,320,457 B2 | * | 1/2008 | Heim et al. | 251/129.06 |
| 2006/0283486 A1 | * | 12/2006 | de Larios et al. | |
| 2007/0110836 A1 | * | 5/2007 | Fork et al. | |
| 2007/0256736 A1 | * | 11/2007 | Tonkovich et al. | |

* cited by examiner

*Primary Examiner*—Douglas A Hess
(74) *Attorney, Agent, or Firm*—Martine Penilla & Gencarella, LLP

(57) ABSTRACT

A method for transporting a substrate is provided. In this method, a non-Newtonian fluid is provided and the substrate is suspended in the non-Newtonian fluid. The non-Newtonian fluid is capable of supporting the substrate. Thereafter, a supply force is applied on the non-Newtonian fluid to cause the non-Newtonian fluid to flow, whereby the flow is capable of moving the substrate along a direction of the flow. Apparatuses and systems for transporting the substrate using the non-Newtonian fluid also are described.

13 Claims, 7 Drawing Sheets

METHOD AND APPARATUS FOR TRANSPORTING A SUBSTRATE USING NON-NEWTONIAN FLUID

CROSS REFERENCE TO RELATED APPLICATIONS

This application is a Divisional of application Ser. No. 11/154,129, filed on Jun. 15, 2005, now U.S. Pat. No. 7,416,370 from which priority under 35 U.S.C. § 120 is claimed. The disclosure of this Application is incorporated herein by reference.

BACKGROUND

A substrate, such as a semiconductor wafer, can be moved from one location to another location by a variety of methods. For example, mechanical rollers are typically used in semiconductor manufacturing systems to move the substrate within the system. Specifically, a substrate may be placed between rollers such that the tapered surfaces of the rollers catch the edges of the substrate. To move the substrate, the rollers rotate to push the substrate towards a direction of the rotation. The problem with rollers, and other mechanical devices, is that the mechanisms associated with the rollers can be complicated. Furthermore, rollers must make contact with the substrate to move the substrate. Such contact can exert considerable stress on the substrate, which may lead to the degradation of the substrate.

Water also has been used to move a substrate. For example, the substrate can be placed in a flow of water to move the substrate in a direction of the flow. The problem with using water to transport the substrate is that the substrate can sink and stick to a bottom surface, thereby impeding transport of the substrate. When the substrate is stuck to a surface, the substrate cannot easily be dislodged. The substrate sinks to the bottom because water cannot support the substrate. Accordingly, the use of water to transport the substrate can be unreliable and the substrate is prone to being stuck at the bottom.

In view of the foregoing, there is a need to provide a simpler and more reliable method and apparatus to transport the substrate.

SUMMARY

Broadly speaking, the present invention fills these needs by providing methods, apparatuses, and systems for transporting a substrate. It should be appreciated that the present invention can be implemented in numerous ways, including as a method, a system, or a device. Several inventive embodiments of the present invention are described below.

In accordance with a first aspect of the present invention, an apparatus is provided that includes a chamber with a cavity in a form of a conduit. The conduit is configured to convey a non-Newtonian fluid to enable transport of a substrate through the conduit.

In accordance with a second aspect of the present invention, a system for transporting a substrate is provided. The system includes a chamber that has an input end, an output end, and an input port in a wall of the chamber. The input end defines a first opening capable of receiving the substrate and the output end defines a second opening. The input port is proximate to the first opening and configured to port a non-Newtonian fluid into the chamber. The system additionally includes a non-Newtonian fluid applicator coupled to the input port. The non-Newtonian fluid applicator is configured to port the non-Newtonian fluid through the input port into the chamber to enable a flow of the non-Newtonian fluid towards the second opening, whereby the flow is capable of moving the substrate from the first opening to the second opening.

In accordance with a third aspect of the present invention, a method for transporting a substrate is provided. In this method, a non-Newtonian fluid is provided and the substrate is suspended in the non-Newtonian fluid. The substrate can be suspended because the non-Newtonian fluid is capable of supporting the substrate. Thereafter, a supply force is applied on the non-Newtonian fluid to cause the non-Newtonian fluid to flow, whereby the flow is capable of moving the substrate along a direction of the flow.

In accordance with a fourth aspect of the present invention, a method for transporting a substrate is provided. In this method, a chamber in a form of a conduit is filled with a non-Newtonian fluid. The chamber has an input end and an output end. The substrate is introduced into the chamber at the input end such that the substrate is suspended in the non-Newtonian fluid. Additional non-Newtonian fluids are forced through the chamber such that a flow of the non-Newtonian fluid moves over surfaces of the substrate and the non-Newtonian fluid exits at the output end.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods, apparatuses, and systems for transporting a substrate. It will be obvious, however, to one skilled in the art, that the present invention may be practiced without some or all of these specific details. In other instances, well known process operations have not been described in detail in order not to unnecessarily obscure the present invention.

The embodiments described herein provide methods, apparatuses, and systems for transporting a substrate using a non-Newtonian fluid. Essentially, the substrate is transported by placing the substrate in a flow of the non-Newtonian fluid. The flow of the non-Newtonian fluid moves the substrate along a direction of the flow. As will be explained in more detail below, in one embodiment, an apparatus for transporting the substrate includes a chamber that has a cavity in a form of a conduit. The conduit can convey the non-Newtonian fluid to enable transport of the substrate through the conduit.

Figure 1:
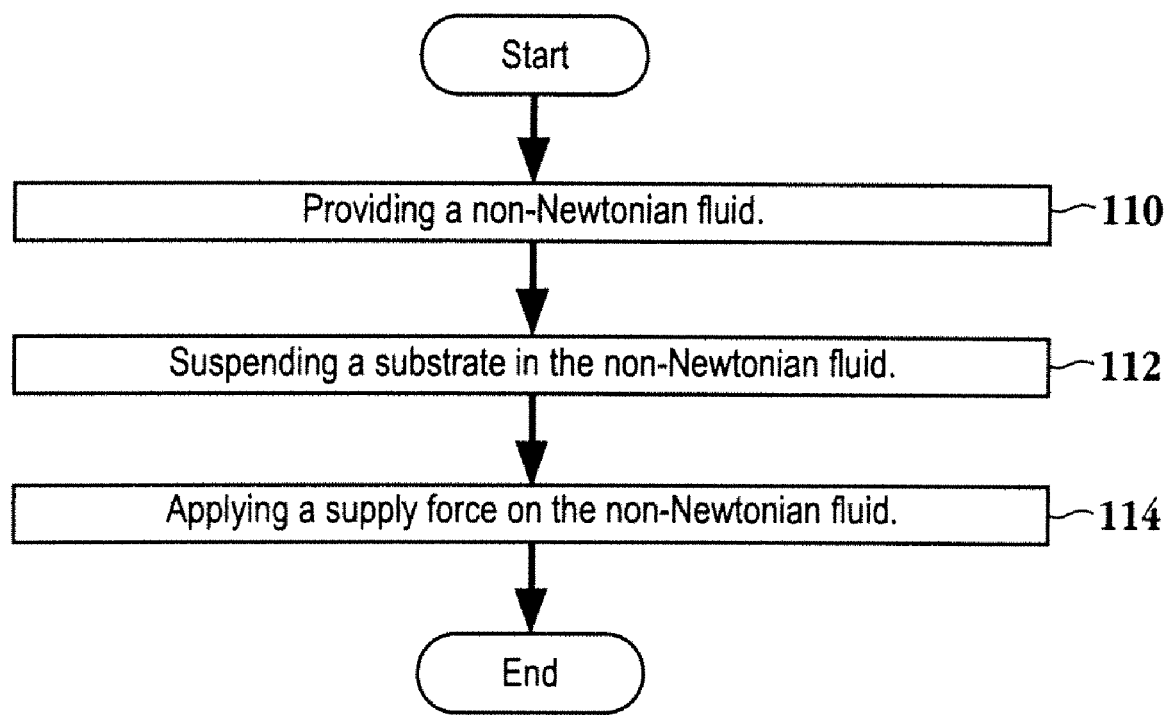
FIG. 1 is a flowchart diagram of a high level overview of a method for transporting a substrate, in accordance with one embodiment of the present invention.

FIG. 1 is a flowchart diagram of a high level overview of a method for transporting a substrate, in accordance with one embodiment of the present invention. As shown in FIG. 1, a non-Newtonian fluid is first provided in operation 110. The non-Newtonian fluid is a fluid in which the viscosity changes with an applied shear force. An example of a non-Newtonian fluid is a soft condensed matter which occupies a middle ground between the extremes of a solid and a liquid. The soft condensed matter is easily deformable by external stresses and examples of the soft condensed matter include emulsions, colloids, foam, etc. It should be appreciated that an emulsion is a mixture of immiscible liquids such as, for example, toothpaste, mayonnaise, oil in water, etc. A colloid is polymers dispersed in water, and gelatin is an example of a colloid. Foam is gas bubbles defined in a liquid matrix, and shaving cream is an example of a foam.

After the non-Newtonian fluid is provided, a substrate is suspended in the non-Newtonian fluid in operation 112. In other words, the substrate is immersed in the non-Newtonian fluid. The non-Newtonian fluid can support the substrate almost indefinitely, even without flow, because the non-Newtonian fluid is characterized by a yield point below which the non-Newtonian fluid does not flow. The weight of the substrate is sufficiently small such that the substrate resting on the non-Newtonian fluid does not exceed the yield point of the non-Newtonian fluid. Accordingly, the non-Newtonian fluid can support the substrate.

A substrate is any suitable base material. In one exemplary embodiment, the substrate is a semiconductor wafer, which is a thin slice of semiconductor material, such as a silicon crystal, upon which microcircuits are constructed by diffusion and deposition of various materials. In another exemplary embodiment, the substrate is a hard disk platter, which is composed of a round, rigid plate with a magnetic media coating.

Still referring to FIG. 1, after the substrate is suspended in the non-Newtonian fluid, a supply force is applied on the non-Newtonian fluid in operation 114 to cause the non-Newtonian fluid to flow. As will be explained in more detail below, since the substrate is suspended in the non-Newtonian fluid, the flow of the non-Newtonian fluid exerts a force on the substrate and moves the substrate along a direction of the flow. As a result, a flow of the non-Newtonian fluid can transport the substrate.

Figure 2A:
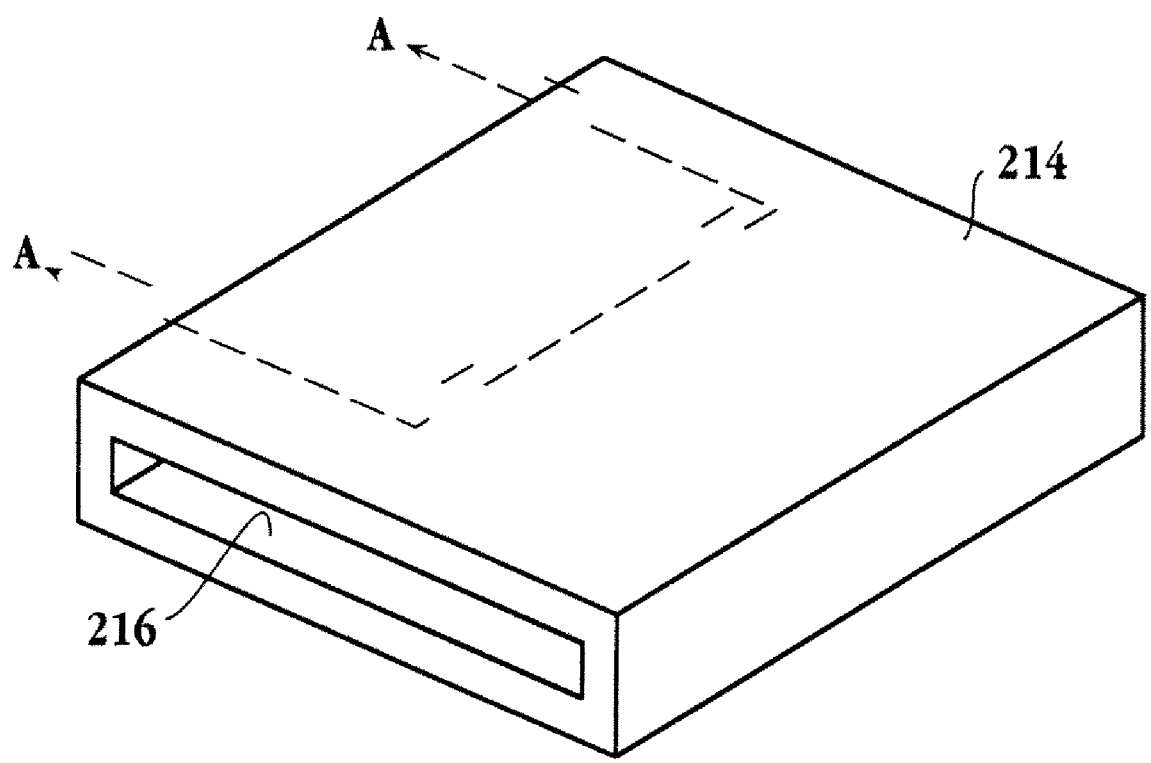
FIG. 2A is a simplified perspective view of an apparatus for transporting a substrate along a horizontal direction, in accordance with one embodiment of the present invention.

FIG. 2A is a simplified perspective view of an apparatus for transporting a substrate along a horizontal direction, in accordance with one embodiment of the present invention. Apparatus 214 includes chamber 216 that has a cavity in a form of a conduit. As will be explained in more detail below, the conduit is configured to convey a non-Newtonian fluid to enable transport of a substrate through the conduit. FIG. 2A shows that the cavity has a rectangular shape. However, it should be appreciated that the cavity may be defined by any suitable shape dimensioned to accommodate and transport the substrate. For example, in another embodiment, the cavity can have a cylindrical shape.

Figure 2B:
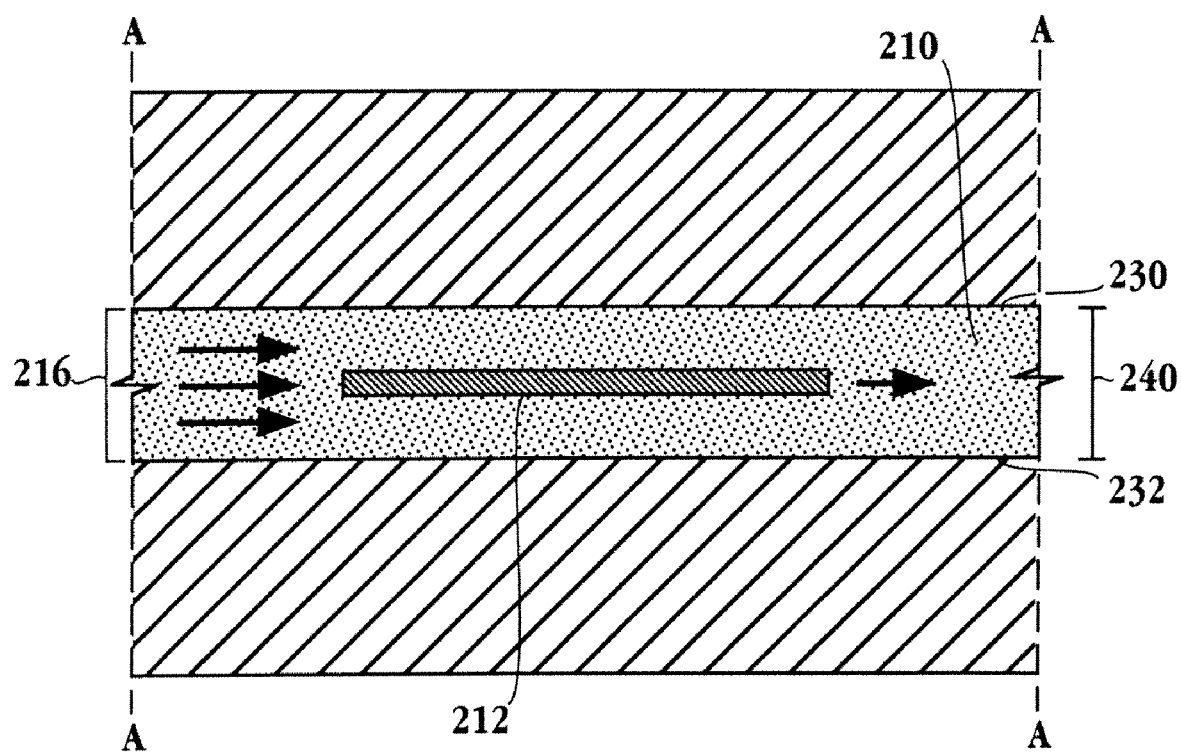
FIG. 2B is a sectional, side view of a transport portion of the apparatus shown in FIG. 2A.

FIG. 2B is a sectional, side view of a transport portion of the apparatus shown in FIG. 2A along cutting plane line A-A. As shown in FIG. 2B, chamber 216 of apparatus 214 is filled with non-Newtonian fluid 210. Substrate 212 is suspended within non-Newtonian fluid 210. A transport portion of chamber 216 is defined by a channel conduit dimensioned to transport substrate 212. For example, FIG. 2B shows a partially enclosed conduit defining the transport portion. In particular, when viewed from the side, the partially enclosed conduit is defined by top planar surface 230 and bottom planar surface 232 that is oriented relative to the top planar surface such as to enclose substrate 212 between the top planar surface and the bottom planar surface. Height 240 of conduit, as defined by a distance between top planar surface 230 and bottom planar surface 232, can have any suitable dimensions greater than a thickness of substrate 212. For example, if thickness of substrate 212 is one millimeter, then height 240 can be four millimeters.

To transport substrate 212, a supply force is applied on non-Newtonian fluid 210 to cause the non-Newtonian fluid to flow. The supply force may be generated by any suitable methods. For example, supply force may be generated by pumping additional non-Newtonian fluid 210 into the chamber. The flow of non-Newtonian fluid 210 is capable of moving substrate 212 along a direction of the flow. FIG. 2B shows the direction of flow from left to right and substantially parallel to surfaces of substrate 212. The flow of non-Newtonian fluid 210 moves over surfaces of substrate 212 and exerts a force parallel to surfaces of the substrate to move the substrate horizontally from left to right at or close to a velocity of the flow.

Figure 3A:
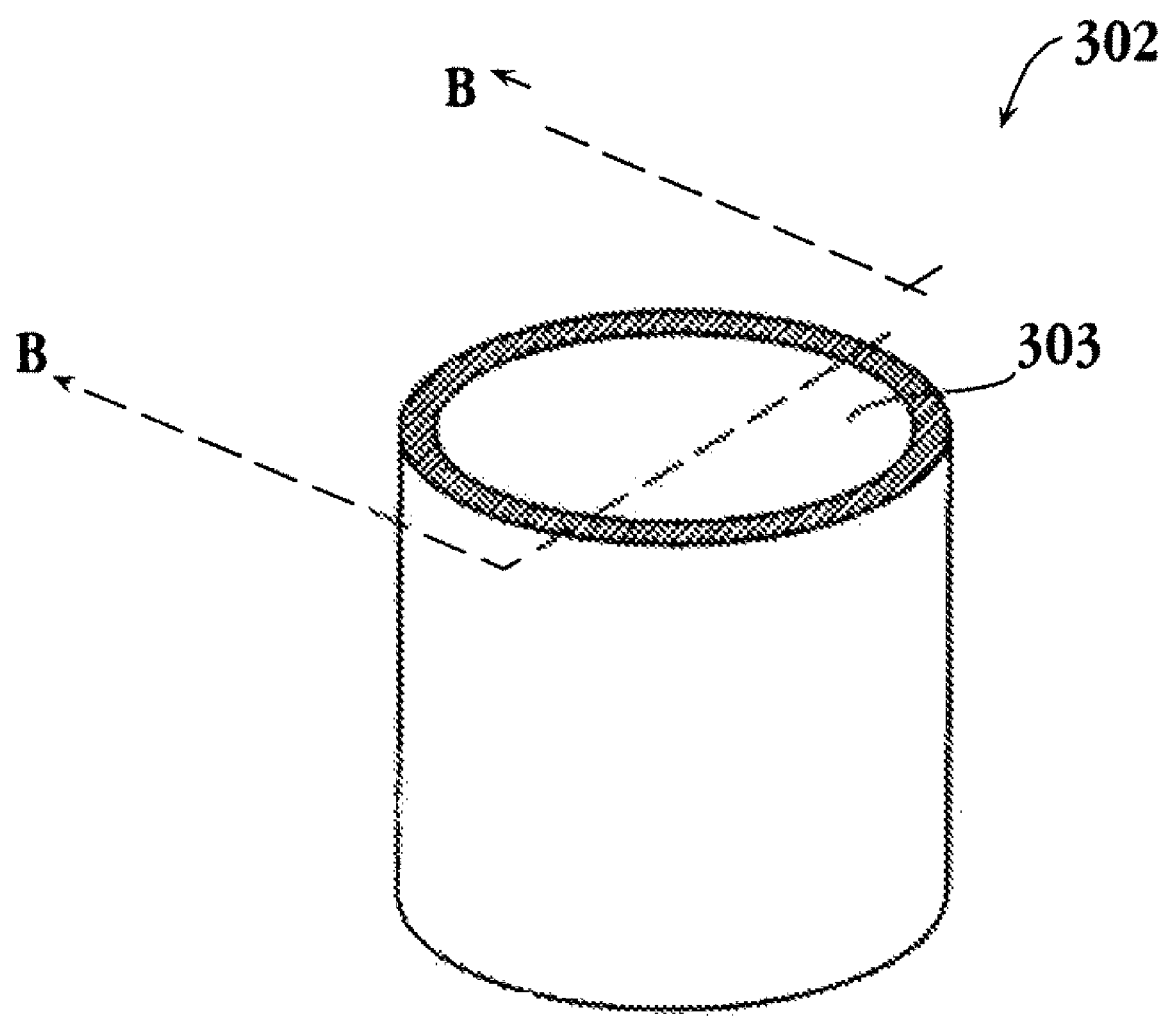
FIG. 3A is a simplified perspective view of an apparatus for transporting a substrate along a vertical direction, in accordance with one embodiment of the present invention.

FIG. 3A is a simplified perspective view of an apparatus for transporting a substrate along a vertical direction, in accordance with one embodiment of the present invention. Apparatus 302 includes chamber 303 that has a cavity in a form of a cylindrical conduit. The conduit is configured to convey a non-Newtonian fluid to enable transport of a substrate through the conduit.

Figure 3B:
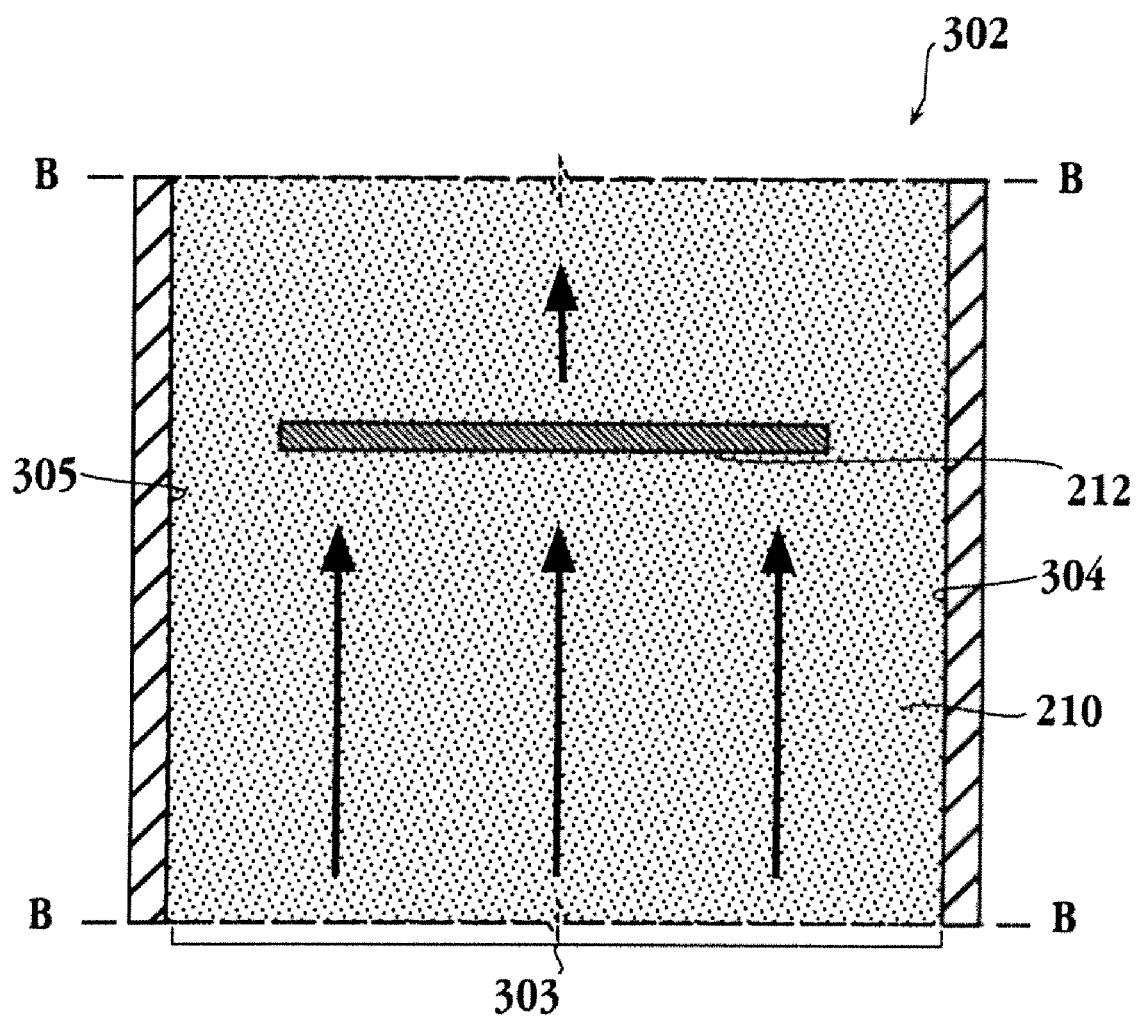
FIG. 3B is a sectional, side view of a transport portion of the apparatus shown in FIG. 3A.

FIG. 3B is a sectional, side view of a transport portion of the apparatus shown in FIG. 3A along cutting plane line B-B. As shown in FIG. 3B, chamber 303 of apparatus 302 is filled with non-Newtonian fluid 210. Substrate 212 is suspended within non-Newtonian fluid 210. The transport portion of chamber 303 is defined by a channel conduit dimensioned to transport substrate 212 vertically. When viewed from the side, the conduit is defined by left vertical surface 305 and right vertical surface 304. Left vertical surface 305 is oriented relative to right vertical surface 304 such as to enclose substrate 212 between the left vertical surface and the right vertical surface. In this embodiment, substrate 212 is oriented substantially perpendicular to left vertical surface 305 and right vertical surface 304.

To transport substrate 212 vertically, a supply force is applied on non-Newtonian fluid 210 to cause the non-Newtonian fluid to flow. As show in FIG. 3B, non-Newtonian fluid 210 flows vertically from bottom to top. The direction of the flow of non-Newtonian fluid 210 is substantially perpendicular to surfaces of substrate 212. Accordingly, the flow exerts forces that are substantially perpendicular to a bottom surface of substrate 212 to move the substrate vertically upwards.

Figure 4A:
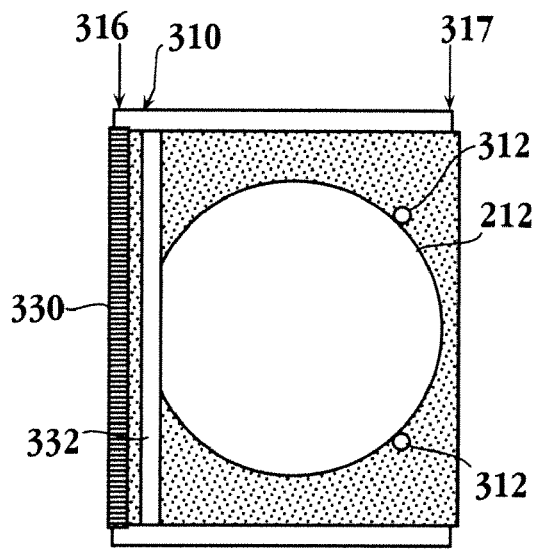
FIG. 4 are various views of another apparatus for transporting a substrate, in accordance with one embodiment of the present invention.
Figure 4B:
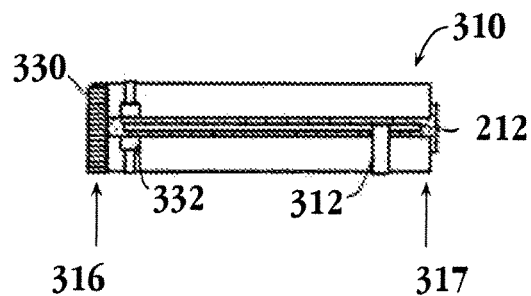
Figure 4C:
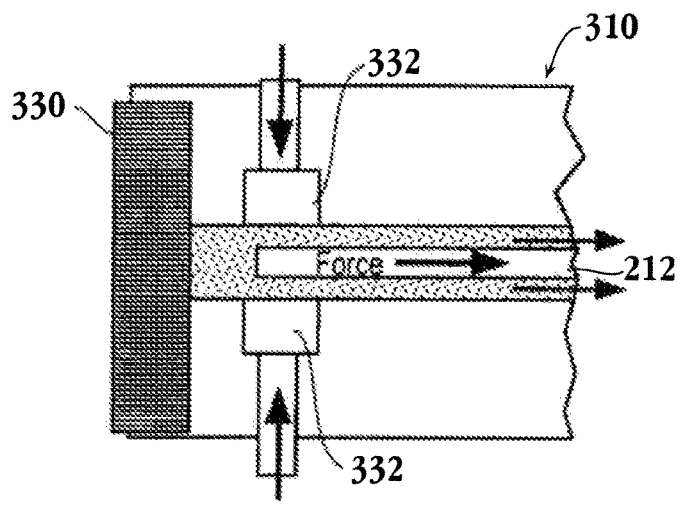

FIG. 4 are various views of another apparatus for transporting a substrate, in accordance with one embodiment of the present invention. FIG. 4 illustrates a top view, a side view, and an expanded side view of apparatus 310. Apparatus 310 includes a chamber, input ports 332, holding pins 312, and panel 330. The chamber has a cavity in a form of a rectangular conduit. The chamber has input end 316 and output end 317 that is located opposite to the input end. Input end 316 is defined by a first opening that is capable of receiving substrate 212. Output end 317 is defined by a second opening that is capable of outputting substrate 212. Additionally included is panel 330 proximate to the first opening at input end 316 that can be used to seal off the first opening.

Apparatus 310 also includes input ports 332 coupled to the walls of the chamber. Input ports 332 are configured to port the non-Newtonian fluid into the chamber. As shown in the top view of FIG. 4, in one embodiment, input ports 332 extend along a width of the chamber. However, it should be appreciated that input ports 332 can have any suitable shapes and sizes. A non-Newtonian applicator (not shown) can be coupled to input ports 332 to port non-Newtonian fluid into the chamber through the input ports. In the embodiment of FIG. 4, apparatus 310 includes two input ports 332 located proximately to input end 36. The side view shows that one of the input ports 332 is located at the top of the chamber and the other input port is located at the bottom. Input ports 332 are placed opposite to each other in order to create opposing flows of the non-Newtonian fluid from the top and bottom. The opposing flows assist in keeping substrate 212 suspended in the middle of the chamber by exerting forces on opposite surfaces of the substrate. However, depending on the desired direction of flow, apparatus 310 can include one input port or more than two input ports. Further, as will be described in more detail below, input ports 332 are located proximate to input end 316 because the desired direction of flow is from the input end to output end 317. Nonetheless, it should be appreciated that input ports 332 may be placed in any suitable location within the chamber to create different flow characteristics.

Still referring to FIG. 4, before substrate 212 is introduced into the chamber of apparatus 310, a non-Newtonian fluid applicator ports a non-Newtonian fluid into the chamber through input ports 332 to fill the chamber with the non-Newtonian fluid. After the chamber is filled with the non-Newtonian fluid, substrate 212 is introduced into the chamber though the first opening at input end 316. Substrate 212 is introduced such that the substrate is suspended in the non-Newtonian fluid. In other words, substrate 212 is placed in the chamber such that the substrate is not in contact with a surface of the chamber. The non-Newtonian fluid has the capability to support substrate 212 such that the substrate is suspended in the middle of the chamber. The opposing flows from input ports 332 also assist in keeping substrate 212 suspended in the middle of the chamber by exerting forces on opposite surfaces of the substrate.

After substrate 212 is introduced into the chamber, panel 330, which is proximate to the first opening at input end 316, closes to seal off the first opening. Since the non-Newtonian fluid cannot exit though the first opening at input end 316, the non-Newtonian fluid ported from input ports 332 flows from the input end towards output end 317 to exit at the second opening at the output end. The flow of the non-Newtonian fluid moves over surfaces of substrate 212 and exerts forces on the substrate in a direction of the flow. As a result, the flow moves substrate 212 towards output end 317.

Embodiments of apparatus 310 can include one or more holding pins 312 within the chamber. Holding pins 312 are used to receive an edge of substrate 212 to prevent the movement of the substrate. In the embodiment of FIG. 4, holding pins 312 are located proximate to output end 317 to prevent substrate 212 from moving through the second opening at the output end when the non-Newtonian fluid flows though the chamber. Holding pins 312 can hold substrate 212 while enabling the non-Newtonian fluid to flow through the conduit. To allow movement of substrate 212, holding pins 312 may be configured to release a hold of the substrate to allow the flow of the non-Newtonian fluid to move the substrate along the conduit and out of the second opening at output end 317. For example, in one embodiment, holding pins 312 can be lowered to allow movement of substrate 212.

Figure 5:
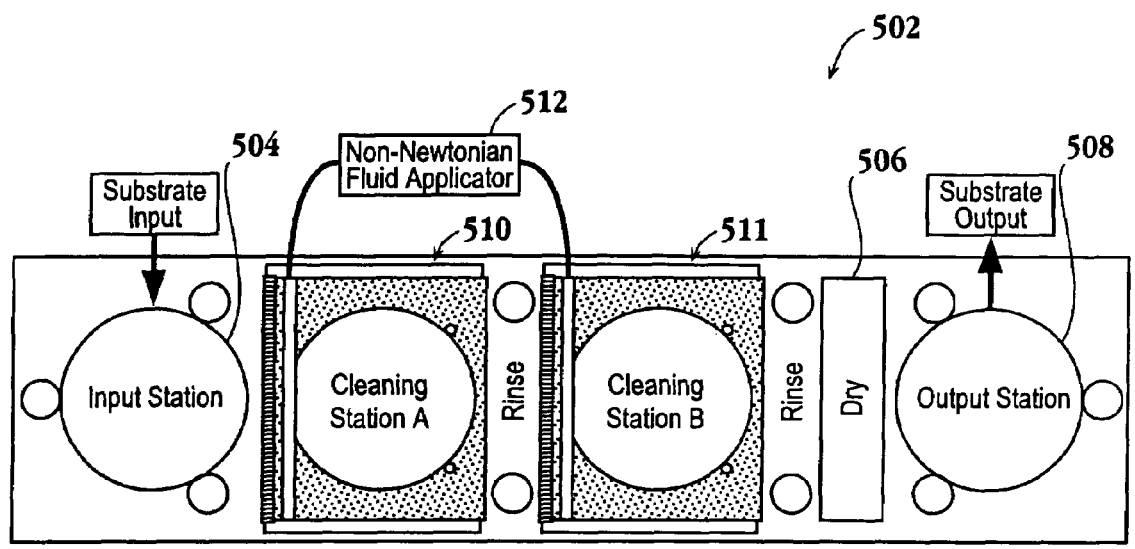
FIG. 5 is a block diagram of a semiconductor substrate cleaning system utilizing the apparatus shown in FIG. 4 to transport a substrate, in accordance with one embodiment of the present invention.

FIG. 5 is a block diagram of a semiconductor substrate cleaning system utilizing the apparatus shown in FIG. 4 to transport a substrate, in accordance with one embodiment of the present invention. Substrate cleaning system 502 is used in a semiconductor device manufacturing process to remove particles and trace metal contamination from a substrate. As shown in FIG. 5, substrate cleaning system 502 includes input station 504, cleaning station A 510, cleaning station B 511, drying station 506, non-Newtonian fluid applicator 512, and output station 508. Embodiments of substrate cleaning system 502 can incorporate the apparatus shown in FIG. 4 in cleaning station A 510 and cleaning station B 511 to transport the substrate. It should be appreciated that cleaning station A 510 and cleaning station B 511 can include any suitable cleaning device configured to clean a substrate. For example, cleaning station A 510 and cleaning station B 511 can use foam to clean the substrate. For more information on the use of foam to clean a substrate, reference may be made to U.S. patent application Ser. No. 11/153,957, filed on Jun. 15, 2005 and entitled "Method and Apparatus for Cleaning a Substrate Using Non-Newtonian Fluids," which is herein incorporated by reference.

An exemplary operation to clean a substrate would start with a substrate inputted into input station 504. Non-Newtonian fluid applicator 512 that is coupled to cleaning station A 510 and cleaning station B 511 provides a non-Newtonian fluid and supply force to port the non-Newtonian fluid into a chamber of cleaning station A 510. After the chamber of cleaning station A 510 is filled with the non-Newtonian fluid, rollers in input chamber 504 push the substrate into the chamber of the cleaning station A to stop at holding pins located within the chamber. When the substrate is fully inserted in cleaning station A 510, a panel of the cleaning station A closes to seal off an opening of the cleaning station. Using a suitable cleaning method, cleaning station A 510 then cleans the substrate. After the substrate is cleaned, the holding pins are lowered to allow the substrate to move with the flow of the non-Newtonian fluid out of cleaning station A 510.

After cleaning station A 510 cleans the substrate, the substrate is rinsed and introduced into cleaning station B 511 for a second cleaning. Cleaning station B 511 can use the same cleaning process as cleaning station A 510 or use a different cleaning process. After cleaning station B 511 cleans the substrate, the substrate is transported out of the cleaning station B using a flow of the non-Newtonian fluid, and the substrate is rinsed and then dried at drying station 506. Thereafter, rollers pushes the cleaned, dried substrate out to output station 508, where the substrate is outputted from substrate cleaning system 502.

In summary, the above described embodiments provide methods, apparatuses, and systems for transporting a substrate. Basically, a flow of non-Newtonian fluid is used to move the substrate from one location to another location. Unlike water, the non-Newtonian fluid can support the substrate. As a result, the substrate will not sink and stick to the bottom when placed in the non-Newtonian fluid. Furthermore, since the non-Newtonian fluid can support the substrate, no mechanical mechanisms make contact with the substrate during transport. The non-Newtonian fluid does not exert any notable stress on the substrate. As a result, unlike the use of rollers, the substrate can be transported by the non-Newtonian fluid without significant stress on the substrate.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. An apparatus, comprising:
    a chamber having a cavity in a form of a conduit, the conduit being configured to convey a non-Newtonian fluid to enable transport of a substrate through the conduit;
    an input port in a wall of the chamber, the input port being configured to port the non-Newtonian fluid into the chamber;
    wherein the chamber has an input end and an output end, the input end defining a first opening capable of receiving the substrate, the output end defining a second opening capable of outputting the substrate, a holding pin within the chamber that is proximate to the second opening, the holding pin being configured to receive an edge of the substrate to prevent movement of the substrate while conveying the non-Newtonian fluid.

2. The apparatus of claim 1, further comprising:
    a panel proximate to the first opening configured to seal off the first opening.

3. The apparatus of claim 1, wherein the non-Newtonian fluid is defined as soft condensed matter.

4. A method for transporting a substrate, comprising method operations of: providing a non-Newtonian fluid;
    suspending the substrate in the non-Newtonian fluid, the non-Newtonian fluid being capable of supporting the substrate; and
    applying a supply force on the non-Newtonian fluid to cause the non-Newtonian fluid to flow, the flow being capable of moving the substrate along a direction of the flow.

5. The method of claim 4, wherein the method operation of suspending the substrate in the non-Newtonian fluid includes, immersing the substrate in the non-Newtonian fluid.

6. A method for transporting a substrate, comprising method operations of:
    filling a chamber in a form of a conduit with a non-Newtonian fluid, the chamber having an input end and an output end;
    introducing the substrate into the chamber at the input end such that the substrate is suspended in the non-Newtonian fluid; and
    forcing additional non-Newtonian fluids through the chamber such that a flow of the non-Newtonian fluid moves over surfaces of the substrate and the non-Newtonian fluid exits at the output end.

7. The method of claim 6, wherein the substrate is held within the chamber while enabling the non-Newtonian fluid to flow through the chamber.

8. The method of claim 7, further comprising:
    releasing the hold of the substrate to enable the flow of the non-Newtonian fluid to move the substrate along the chamber and out of the output end.

9. A system for transporting a substrate, comprising:
    a chamber having an input end defining a closeable opening through which the substrate is introduced, and an output end, the chamber having a top wall and a bottom wall, the top wall and the bottom wall both having opposing inlets defined therethrough, the output end defining a second opening, the opposing inlets being proximate to the first opening;
    a non-Newtonian fluid disposed within the chamber, the non-Newtonian fluid forced through both of the inlets simultaneously wherein the substrate is inserted through the closeable opening into the chamber having the non-Newtonian fluid, the non-Newtonian fluid supporting the substrate in the chamber; and
    a panel closing the opening of the input end thereby directing a flow of the non-Newtonian fluid to the second opening to cause movement of the substrate to the second opening.

10. The system of claim 9, further comprising:
    a holding pin within the chamber that is proximate to the second opening, the holding pin being configured to receive an edge of the substrate to prevent the substrate from moving through the second opening when the non-Newtonian fluid flows through the chamber.

11. The system of claim 10, wherein the holding pin is configured to move out of a pathway of the substrate to enable the substrate to exit the chamber through the second opening with the non-Newtonian fluid.

12. The system of claim 9, wherein a direction of the movement is substantially parallel to a surface of the top wall and a surface of the bottom wall.

13. The system of claim 9, wherein the non-Newtonian fluid is defined as one or more of a foam, a colloid, and an emulsion.

* * * * *